US010880995B2

(12) United States Patent
Aubert et al.

(10) Patent No.: US 10,880,995 B2
(45) Date of Patent: Dec. 29, 2020

(54) PRINTED CIRCUIT BOARD WITH STRESS RELIEF ZONES FOR COMPONENT AND SOLDER JOINT PROTECTION

(71) Applicant: 2449049 Ontario Inc., Mississauga (CA)

(72) Inventors: Andrew Clark Baird Aubert, Oakville (CA); Sebastian Durzynski, Mississauga (CA); Jonathan William Perry, Toronto (CA)

(73) Assignee: 2449049 Ontario Inc., Mississauga (CA)

( * ) Notice: Subject to any disclaimer, the term of this patent is extended or adjusted under 35 U.S.C. 154(b) by 0 days.

(21) Appl. No.: 16/178,820

(22) Filed: Nov. 2, 2018

(65) Prior Publication Data

US 2019/0191551 A1 Jun. 20, 2019

Related U.S. Application Data

(60) Provisional application No. 62/599,122, filed on Dec. 15, 2017.

(51) Int. Cl.
H05K 1/02 (2006.01)
H01L 23/00 (2006.01)
H05K 3/34 (2006.01)
H05K 3/46 (2006.01)

(52) U.S. Cl.
CPC ......... *H05K 1/0271* (2013.01); *H01L 23/562* (2013.01); *H01L 24/26* (2013.01); *H05K 1/0278* (2013.01); *H05K 3/34* (2013.01); *H05K 3/4691* (2013.01); *H01L 2924/351* (2013.01); *H05K 2201/09063* (2013.01); *H05K 2201/10106* (2013.01)

(58) Field of Classification Search
CPC ....... H01L 2251/5338; H01L 23/49838; H01L 23/562; H01L 51/0097; H05K 2201/09063; H05K 1/0271; H05K 1/028; H05K 3/4691
USPC .................... 174/255; 257/E23.004; 438/637
See application file for complete search history.

(56) References Cited

U.S. PATENT DOCUMENTS

| 4,959,751 A | 9/1990 | Hearn et al. |
| 5,144,534 A | 9/1992 | Kober |
| 5,224,023 A | 6/1993 | Smith et al. |
| 5,690,270 A | 11/1997 | Gore |
| 6,011,693 A | 1/2000 | Gore |

(Continued)

FOREIGN PATENT DOCUMENTS

| CN | 102231944 | 11/2011 |
| JP | 2844085 B2 | 1/1999 |

(Continued)

OTHER PUBLICATIONS

International Search Report dated Feb. 5, 2019.

(Continued)

*Primary Examiner* — Jonathan Han
(74) *Attorney, Agent, or Firm* — Caesar Rivise, PC (57) ABSTRACT

A printed circuit board (PCB) with at least one mechanical stress relief zone and at least one electrical component zone, wherein the at least one mechanical stress relief zone allows the PCB to flex proximate the at least one mechanical stress relief zone of the PCB without compromising the at least one electrical component zone.

23 Claims, 7 Drawing Sheets

(56) References Cited

U.S. PATENT DOCUMENTS

| | | |
|---|---|---|
| 6,908,583 B2 | 6/2005 | Fiedler et al. |
| 6,927,344 B1 | 8/2005 | Gall et al. |
| 7,829,794 B2 | 11/2010 | Yang et al. |
| 8,406,009 B2 | 3/2013 | Lev et al. |
| 9,660,365 B2 | 5/2017 | Baur et al. |
| 9,748,723 B2 | 8/2017 | Sussman |
| 2004/0129452 A1* | 7/2004 | Owens .................. H01L 21/481 174/260 |
| 2005/0017354 A1* | 1/2005 | Paul ....................... H01L 23/13 257/738 |
| 2008/0105455 A1* | 5/2008 | Palfreyman .......... H05K 1/0271 174/254 |
| 2009/0277669 A1 | 11/2009 | Kuan et al. |
| 2012/0186860 A1 | 7/2012 | Takaoka |
| 2014/0168913 A1 | 6/2014 | Fornage |
| 2014/0209360 A1* | 7/2014 | Peng ...................... H05K 1/028 174/254 |

FOREIGN PATENT DOCUMENTS

| | | |
|---|---|---|
| WO | 2016084630 A1 | 6/2016 |
| WO | 2016089707 A1 | 6/2016 |

OTHER PUBLICATIONS

The Influence of Several Design and Material Variables on the Propensity for Solder Joint Cracking J. Munford, Sandia Labs, Albuquerque, NM, Published in: IEEE Transactions on Parts, Hybrids, and Packaging (vol. 11 , Issue: 4, Dec. 1975) ; pp. 296-304; Date of Publication: Dec. 1975; DOI: 10.1109/TPHP.1975.1135080.
Differential Thermal Expansion in Microelectronic Systems; B.S.H. Royce Appl. Phys. & Mater. Lab., Princeton Univ., NJ, USA Published in: IEEE Transactions on Components, Hybrids, and Manufacturing Technology (vol. 11, Issue: 4 , Dec. 1988); pp. 454-463; Date of Publication: Dec. 1988; INSPEC Accession Number: 3332539; DOI: 10.1109/33.16683.

\* cited by examiner

FIG. 7

PRINTED CIRCUIT BOARD WITH STRESS RELIEF ZONES FOR COMPONENT AND SOLDER JOINT PROTECTION

FIELD OF THE DISCLOSURE

The present disclosure relates to flexible printed circuit boards (PCB)s of lengths suitable for use in transit vehicles, and in particular with PCBs having light emitting diodes (LED).

BACKGROUND

Current printed circuit hoards (PCBs) of length greater than about 15 inches are rigid and lack the ability to bend and/or flex while maintaining the integrity of the circuit paths and solder joints that connect components to the PCB. Currently, PCBs of length greater than about 15 inches, if not handled carefully will flex or bend and this flexing and/or bending damages the PCB and in particular the electrical connections (solder joints) of electrical components on the PCB as well as current paths on the PCB. Rigid printed circuit boards when flexed or bent (or undergoing mechanical stress) tend to damage solder joints and other electrical connections or electrical conduits as well as electrical components proximate the area undergoing flex (or stress). Once a rigid PCB is damaged, it is disposed of and not usable given the solder joints or conduits or components are no longer functioning as desired. A proposed solution to this is to add stiffeners along the PCB in order to keep the PCB stiff. However, this reduces the ability of the PCB, in particular PCBs of length greater than about 15 inches, to flex when needed. Some PCBs have slots/apertures thereon for receiving fasteners to fasten the PCB to a mounting structure. However, the fastener slots/apertures do not allow for flexing of the PCB while maintaining the integrity of soldered joints and/or electrical conduits and/or electrical connections of the PCB Accordingly there is a need for a PCB, in one alternative, to have the ability to flex facilitating working and handling of said PCB board without compromising the integrity of the solder joints and other electrical connections or conduits thereon. This is particularly important when the PCB is being handled and/or installed and requires some bending or flexing for installation in areas where space is restricted. Further, there is a need for a PCB with at least one flex zone and at least one component zone allowing said PCB to flex (or bend) without compromising the integrity of the at least one component zone.

SUMMARY

According to one aspect, there is provided a printed circuit board (PCB) comprising at least one mechanical stress relief zone and at least one electrical component zone, wherein said at least one mechanical stress relief zone allows said PCB to flex proximate said at least one mechanical stress relief zone of the PCB without compromising said at least one electrical component zone.

In another alternative said at least one electrical component zone is distant said at least one mechanical stress relief zone.

In another alternative, said at least one electrical component zone comprises a plurality of electrical components selected from the group consisting of light-emitting diode (LED), LED controller, resistor, capacitor, diode, inductor, transistor, integrated circuit and combinations thereof. In one alternative, said diode is selected from a transit-voltage-suppression (TVS) diode, general purpose diode, Zener diode, Schottky diode and combinations thereof.

In another alternative, said at least one mechanical stress relief zone has a first thickness and said at least one electrical component zone has a second thickness wherein said first thickness is less than said second thickness. Said first thickness allowing for said PCB to flex proximate said at least one mechanical stress relief zone when said PCB is under stress while maintaining structural integrity of said PCB and maintaining integrity of electrical conduits and connections on said PCB.

In another alternative, said at least one mechanical stress relief zone has a thickness less than the remainder of the PCB.

In another alternative, said at least one mechanical stress relief zone extends substantially normal to a length of said PCB.

In another alternative said at least one mechanical stress relief zone comprises at least one aperture extending from a top of said PCB board through to a bottom of said PCB board such that said at least one aperture allowing for said PCB to flex proximate said at least one mechanical stress relief zone when said PCB is under stress. In another alternative, said at least one aperture is oriented substantially normal, preferably normal to a length of said PCB. In another alternative, said at least one aperture is a slot, such as but not limited to a groove, notch or slit. In another alternative, said at least one aperture is selected from the group consisting of an oval, circle, ellipse, polygon and combinations thereof. In another alternative, said at least one polygon is selected from the group consisting of a polygon having at least three sides, preferably from three to twenty sides. In a preferred embodiment, the aperture is selected from a triangle, rectangle, square, pentagon, hexagon, heptagon, octagon and combinations thereof. In one alternative, said at least one mechanical stress relief zone is a plurality of apertures extending from a top of said PCB board through to a bottom (the other side of said PCB) of said PCB board such that said plurality of apertures allowing for said PCB to flex proximate said at least one mechanical stress relief zone when said PCB is under stress. In another alternative, said at least one aperture is oriented substantially normal to a length of the PCB. In another alternative, said plurality of apertures are oriented substantially normal to a length of the PCB. In another alternative, said plurality of apertures are spaced apart from each other and parallel to each other and optionally oriented substantially normal to a length of said PCB. In another alternative, said plurality of apertures are at least two spaced apart slots parallel to each other and optionally running substantially normal to a length of said PCB.

In another alternative, said at least one aperture is oriented substantially parallel to a length of the PCB. In another alternative, said plurality of apertures are oriented substantially parallel to a length of the PCB. In another alternative, said plurality of apertures are spaced apart slots parallel to each other optionally running substantially parallel to a length of said PCB. In another alternative, said plurality of slots comprise spaced apart slots running substantially parallel to a length of said PCB and spaced apart slots running substantially normal to a length of said PCB.

According to yet another alternative, there is provided a printed circuit board (PCB) having a length of at least about 15 inches, preferably from about 15 inches to about 60 inches, wherein said PCB further comprises at least one mechanical stress relief zone and at least one electrical component zone. In one alternative said at least one electrical component zone is distant said at least one mechanical stress relief zone, said at least one mechanical stress relief zone allowing for said PCB to be rigid when not under stress, and allowing for said PCB to flex (or less rigid) proximate said at least one mechanical stress relief zone when under stress while maintaining said at least one electrical component zone rigid and not compromising any solder joints or connections or components while under stress.

In one alternative, the at least one stress relief zone is strategically located away from soldered joints and components allowing for the PCB to be less stiff (flex when needed) in the stress relief zone thus allowing for a more robust PCB, especially when handling and/or installing said boards of lengths greater than 15 inches or so.

In another alternative, said PCB is substantially rigid having at least one mechanical stress relief zone and at least one electrical component zone. In another alternative, said PCB is unitary. In yet another alternative, there is provided a PCB of length between about 15 to about 60 inches, a width between about 0.75 to about 4 inches and a thickness of between about 0.03 to about 0.12 inches wherein said PCB comprises a series of layers wherein a top layer is copper (for electrical channels and connections (solder points), known to persons of skill in the art, a middle layer is fiberglass of various gradings such as gradings known to persons skilled in the art including from FR1 to FR6, preferably FR4 (mechanical rigidity)—composition between fiberglass and epoxy resin and optionally a bottom layer such as copper for electrical channels (preferably identical to said top layer). Said top and bottom copper layer being typically treated with a solder mask to protect copper traces from unwanted conductivity. In one alternative, said copper layers being adhered to said fiberglass layer via lamination or the like. Said PCB further comprising at least one electrical component zone comprising at least one electrical component selected from the group consisting of LED, LED controller, resistor, capacitor, diode, inductor, transistor, integrated circuit and combinations thereof. In one alternative, said diode is selected from a TVS diode, general purpose diode, Zener diode, Schottky diode and combinations thereof, and at least one mechanical stress relief zone proximate said at least one electrical component zone; said at least one mechanical stress relief zone comprising at least one area on the PCB with a thickness less than a thickness of said at least one electrical component zone. In one alternative, said at least one mechanical stress relief zone is at least one aperture, as described herein, extending from a top of said PCB to a bottom of said PCB. In another alternative, said at least one mechanical stress relief zone is a slot running substantially normal to said length of said PCB. In one alternative, said at least one mechanical stress relief zone comprises a plurality of apertures running substantially normal to said length of said PCB. In one alternative, said at least one mechanical stress relief zone comprises a plurality of spaced apart parallel slots running substantially normal to said length of said PCB.

According to one aspect, there is provided a printed circuit board (PCB) comprising a plurality of mechanical stress relief zones and a plurality of electrical component zones, wherein said plurality of mechanical stress relief zones allow said PCB to flex proximate said plurality of mechanical stress relief zones of the PCB without compromising the integrity of said plurality of electrical component zones.

In another alternative said plurality of electrical component zones are distant said plurality of mechanical stress relief zones.

In another alternative, said plurality of electrical component zones comprise a plurality of electrical components selected from the group consisting of LED, LED controller, resistor, capacitor, diode, inductor, transistor, integrated circuit and combinations thereof. In one alternative, said diode is selected from a TVS diode, general purpose diode, Zener diode, Schottky diode and combinations thereof.

In another alternative, each of said plurality of mechanical stress relief zones have a first thickness and each of said plurality of electrical component zones have a second thickness wherein said first thickness is less than said second thickness. Said First thickness allowing for said PCB to flex proximate said plurality of mechanical stress relief zones when said PCB is under stress while maintaining structural integrity of said PCB and maintaining integrity of electrical conduits and connections on said PCB.

In another alternative, each of said plurality of mechanical stress relief zones have a thickness less than the remainder of the PCB.

In another alternative, said plurality of mechanical stress relief zones extend substantially normal to a length of said PCB.

In another alternative each of said plurality of mechanical stress relief zones comprise at least one aperture extending from a top of said PCB board through to a bottom of said PCB board such that said at least one aperture allowing for said PCB to flex proximate each of said plurality of mechanical stress relief zones when said PCB is under stress. In another alternative, said at least one aperture is oriented substantially normal, preferably normal to a length of said PCB. In another alternative, said at least one aperture is a slot. In another alternative, said at least one aperture is selected from the group consisting of an oval, circle, ellipse, polygon and combinations thereof. In another alternative, said at least one polygon is selected from the group consisting of a polygon having at least three sides, preferably from three to twenty sides. In a preferred embodiment, a triangle, rectangle, square, pentagon, hexagon, heptagon, octagon and combinations thereof. In one alternative, each of said plurality of mechanical stress relief zones is a plurality of apertures extending from a top of said PCB board through to a bottom (the other side of said PCB) of said PCB board such that said plurality of apertures allowing for said PCB to flex proximate each of said plurality of mechanical stress relief zones when said PCB is under stress. In another alternative, said at least one aperture is oriented substantially normal to a length of the PCB. In another alternative, said plurality of apertures are oriented substantially normal to a length of the PCB. In another alternative, said plurality of apertures are spaced apart from each other and parallel to each other and optionally oriented substantially normal to a length of said PCB. In another alternative, said plurality of apertures are at least two spaced apart slots parallel to each other and optionally running substantially normal to a length of said PCB.

In another alternative, said at least one aperture is oriented substantially parallel to a length of the PCB. In another alternative, said plurality of apertures are oriented substantially parallel to a length of the PCB. In another alternative, said plurality of apertures are spaced apart slots parallel to each other optionally running substantially parallel to a length of said. PCB. In another alternative, said plurality of slots comprise spaced apart slots running substantially parallel to a length of said PCB and spaced apart slots running substantially normal to a length of said PCB.

According to yet another alternative, there is provided a printed circuit board (PCB) having a length of at least about 15 inches, preferably from about 15 inches to about 60 inches, wherein said PCB further comprises a plurality of mechanical stress relief zones and a plurality of electrical component zones. In one alternative each of said plurality of electrical component zones is distant each of said plurality of mechanical stress relief zones, each of said plurality of mechanical stress relief zones allowing for said PCB to be rigid when not under stress, and allowing for said PCB to flex (or less rigid) proximate each of said plurality of mechanical stress relief zones when under stress while maintaining each of said at plurality of electrical component zones rigid and not compromising the integrity of any solder joints or connections or components while under stress.

In one alternative, each of said plurality of mechanical stress relief zones is strategically located away from soldered joints and components allowing for the PCB to be less stiff (flex when needed) in the stress relief zone thus allowing for a more robust PCB, especially when handling and/or installing said boards of lengths greater than 15 inches or so.

In another alternative, said PCB is substantially rigid having a plurality of mechanical stress relief zones and a plurality of electrical component zones.

In another alternative, said PCB is unitary.

In yet another alternative, there is provided a PCB of length between about 15 to about 60 inches, a width between about 0.75 to about 4 inches and a thickness of between about 0.03 to about 0.12 inches wherein said PCB comprises a series of layers wherein a top layer is copper (for electrical channels and connections (solder points), known to persons of skill in the art, a middle layer is fiberglass of various gradings such as gradings known to persons skilled in the art including from FR1 to FR6, preferably FR4 (mechanical rigidity)—composition between fiberglass and epoxy resin and optionally a bottom layer such as copper for electrical channels (preferably identical to said top layer). Said top and bottom copper layer being typically treated with a solder mask to protect copper traces from unwanted conductivity. In one alternative, said copper layers being adhered to said fiberglass layer via lamination or the like. Said PCB further comprising a plurality of electrical component zones comprising at least one electrical component selected from the group consisting of LED, LED controller, resistor, capacitor, diode, inductor, transistor, integrated circuit and combinations thereof. In one alternative, said diode is selected from a TVS diode, general purpose diode, Zener diode, Schottky diode and combinations thereof. Said PCB further comprising a plurality of mechanical stress relief zones proximate said plurality of electrical component zones; each of said plurality of mechanical stress relief zones comprising at least one area on the PCB with a thickness less than a thickness of each of said electrical component zones. In one alternative, each of said plurality of mechanical stress relief zones is at least one aperture, as described herein, extending from a top of said PCB to a bottom of said PCB. In another alternative, each of said plurality of mechanical stress relief zones is a slot running substantially normal to said length of said PCB. In one alternative, each of said plurality of mechanical stress relief zones comprises a plurality of apertures running substantially normal to said length of said PCB. In one alternative, each of said plurality of mechanical stress relief zone comprises a plurality of spaced apart parallel slots running substantially normal to said length of said PCB.

In one alternative said printed circuit board (PCB) further comprises a plurality of mechanical stress relief zones and a plurality of electrical component zones.

In another alternative said plurality of mechanical stress relief zones are distant said plurality of electrical component zones.

In another alternative, said plurality of mechanical stress relief zones have a first thickness and said plurality of electrical component zones have a second thickness wherein said first thickness is less than said second thickness. Said first thickness allowing for said PCB to flex proximate said plurality of mechanical stress relief zones when said PCB is under stress while maintaining structural integrity of said PCB and maintaining integrity of electrical conduits and connections on said PCB.

In another alternative, said plurality of mechanical stress relief zones have a thickness less than the remainder of the PCB.

In another alternative, said plurality of mechanical stress relief zones extend substantially normal to a length of said PCB.

DETAILED DESCRIPTION

Figure 1:
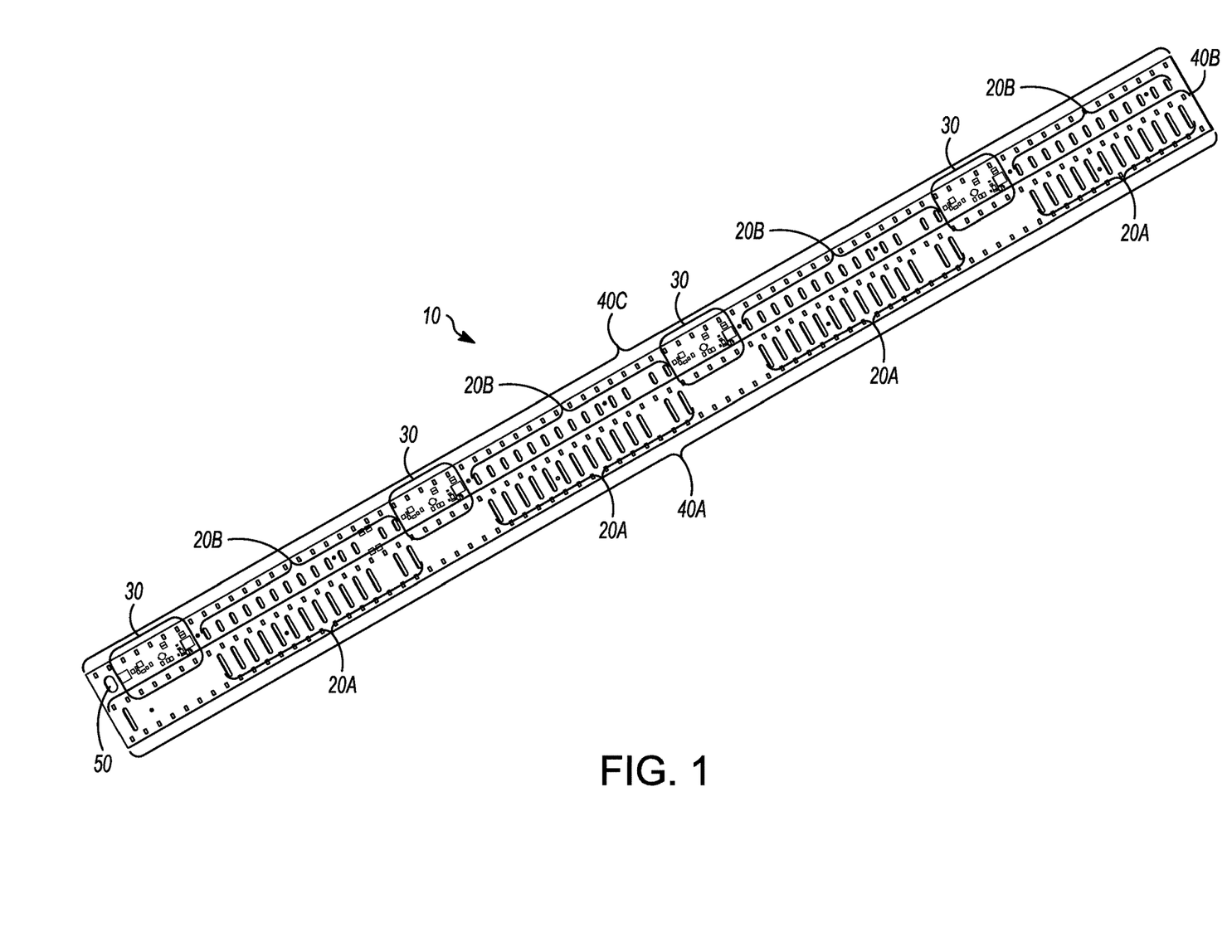
FIG. 1 is a perspective view of a PCB board according to one alternative of the disclosure.

Referring now to FIG. 1, there is provided a printed circuit board 10 rectangular in shape with a plurality of mechanical stress relief zones 20 and a plurality of electrical component zones 30 straddled by the mechanical stress relief zones. The printed circuit board further includes a plurality of LED zones 40. Each mechanical stress relief zone 20 comprises a plurality of spaced apart parallel channels running normal to the length of the board 10.

Figure 4:
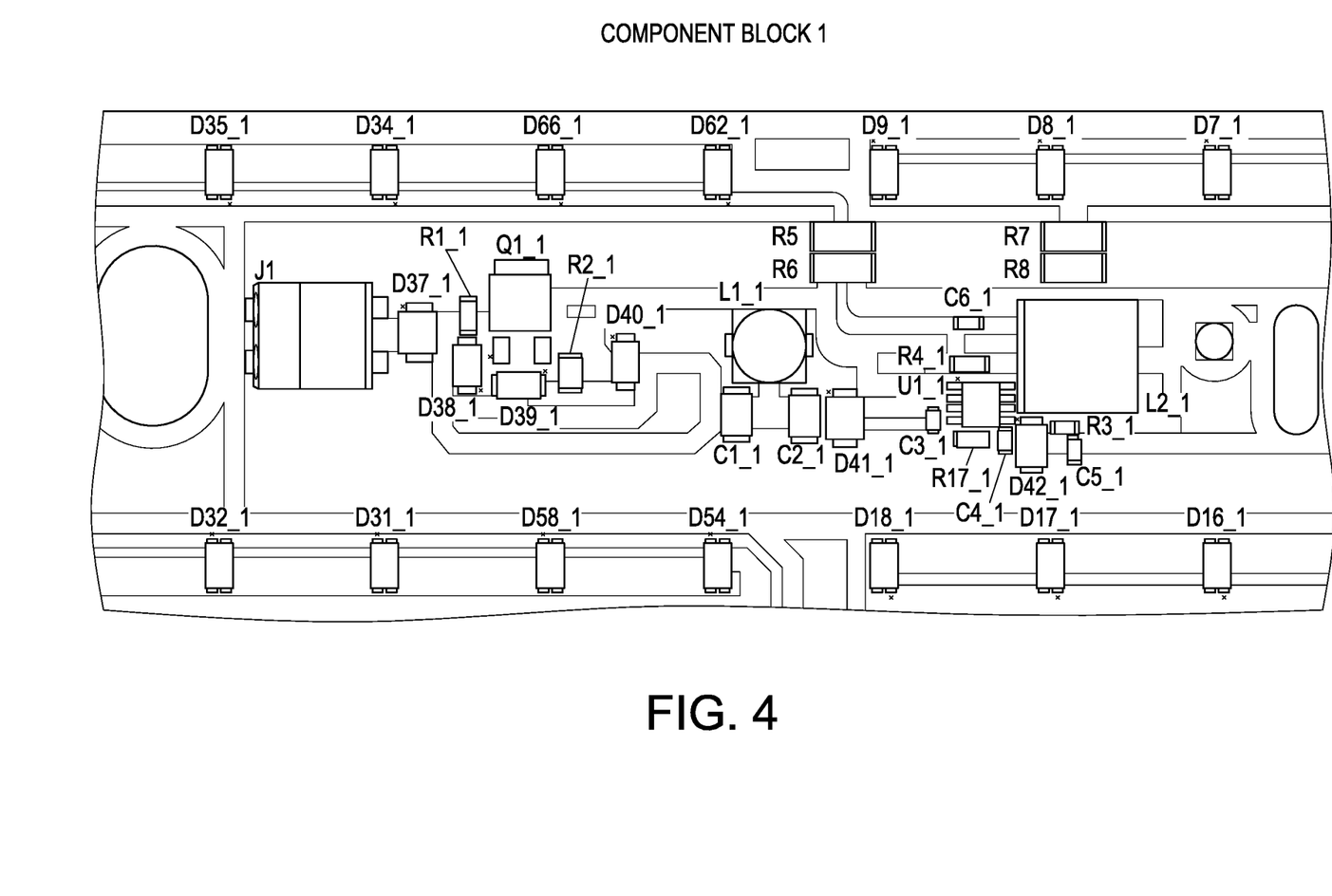
FIG. 4 is a top view of component block 1 of the PCB board of FIG. 1.
Figure 5:
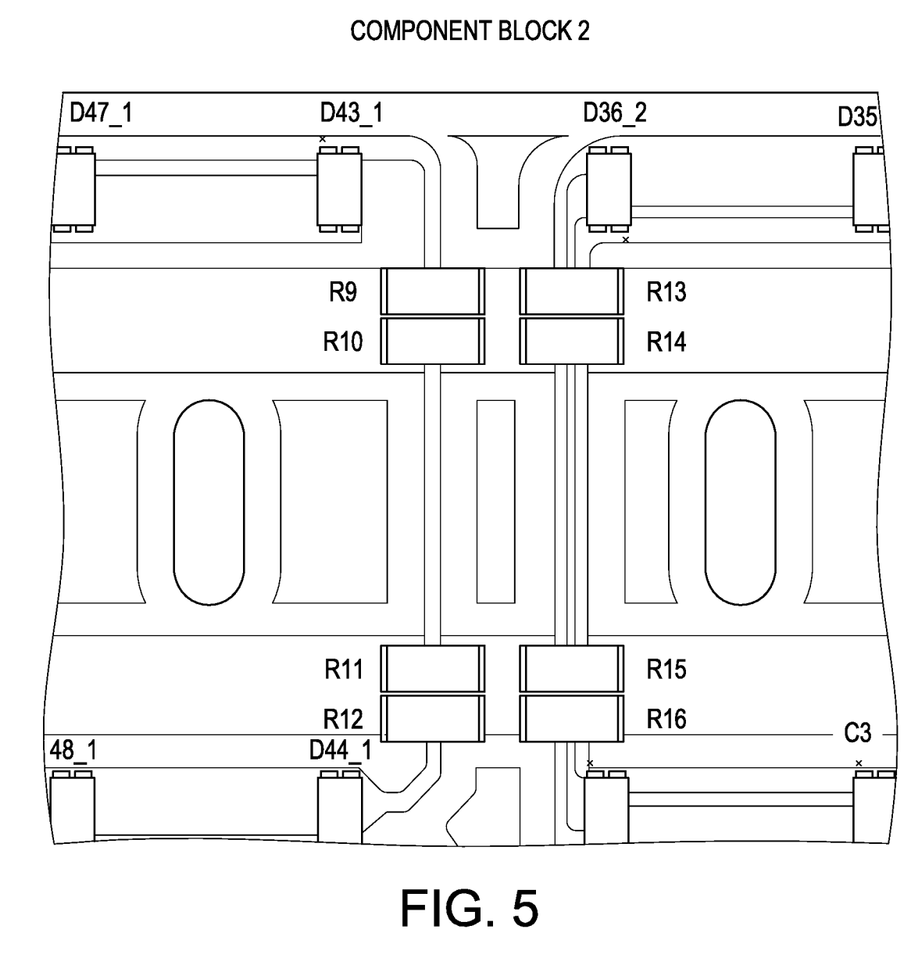
FIG. 5 is a top view of component block 2 of the PCB board of FIG. 1.
Figure 6:
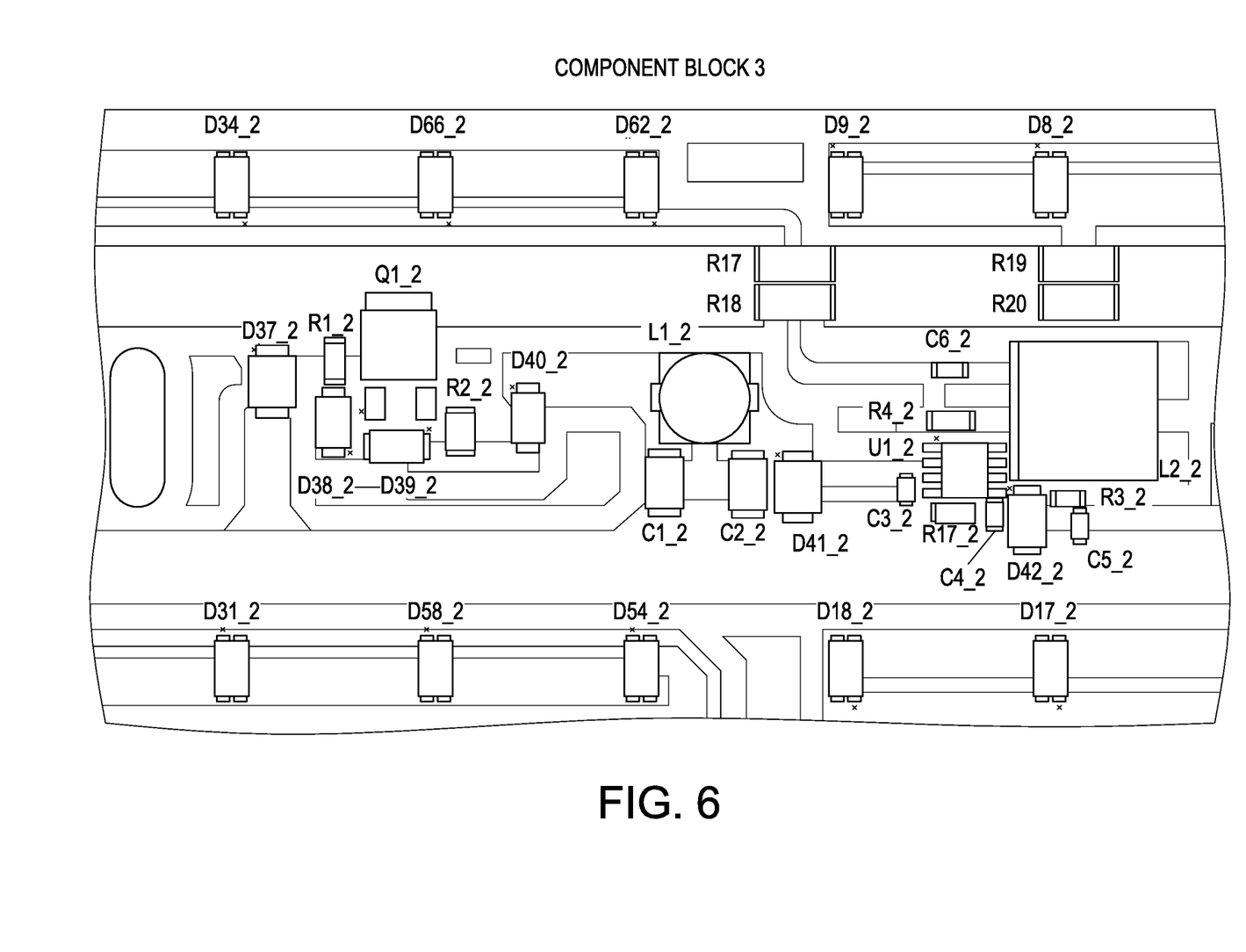
FIG. 6 is a top view of component block 3 of the PCB board of FIG. 1.
Figure 7:
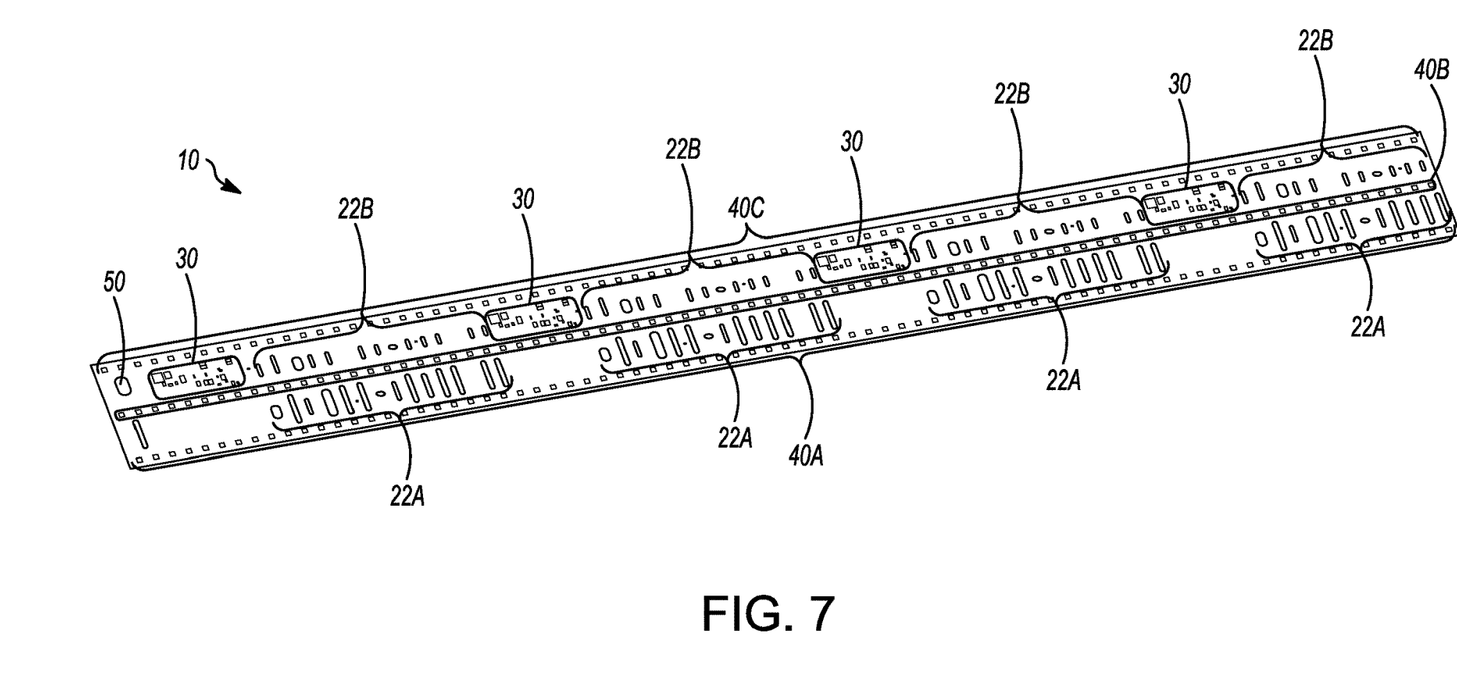
FIG. 7 is a perspective view of a PCB board according to another alternative of the disclosure.

Running along one side of the board 10 each channel of a first length has a length proximate half the width of the board 10, Running along another side of the board, each channel of a second length has a length proximate one quarter of the width of the board. In this alternative the first length is greater than the second length. In this alternative, the channels of first length are separated from the channels of second length by an LED zone 40 running between the channels of first length running along one side and the channels of second length running along another side of the printed circuit board. In this alternative, the board comprises a mechanical stress relief zone 20 followed by an electrical component zone 30 followed by a mechanical stress relief zone 20. This placement or alternating of mechanical stress relief zone 20 with an electrical component zone 30 allows for the board 10 to be substantially rigid yet flexible when under stress while not compromising the integrity of the electrical component zones 30. Each electrical component zone 30 in this alternative comprises a number of electrical components connected to either a load or a power source. The PCB board 10 of FIG. 1 may be divided into three blocks, component block 1 (FIG. 4), component block 2 (FIG. 5) and component block 3 (FIG. 6). The component list for this alternative PCB follows:

| Designator | Value | Tolerance | Electrical Limit | Temperature Coefficient | Package | Type | Manufacturer |
|---|---|---|---|---|---|---|---|
| Component Block 1 | | | | | | | |
| C1_1, C2_1 | 1 u | | 250 V | X7T | 1812 | Capacitor | TDK |
| C3_1, C4_1, C6_1 | 0.1 u | | 250 V | X7T | 0805 | Capacitor | TDK |
| D37_1 | 85 V | | 600 W | | SMB | TVS Diode | Vishay |
| D38_1, D39_1, D40_1 | 1 A | | 600 V | | SMA | General purpose Diode | ON Semiconductor |
| D41_1 | 91 V | | 3 W | | SMB | Zener diode | On Semiconductor |
| D42_1 | 2 A | | 150 V | | SMA | Schottky diode | STMicroelectronics |
| J1 | | | 12 A | | | Connector | Wago |
| L1_1 | 100 uH | | 0.8 A | | SD8328 | Inductor | Coiltronics |
| L2_1 | 820 uH | | 0.42 A | | SRR1240 | Inductor | Bourns |
| Q1_1 | | | 400 V, 4 A, 30 W, | | DPAK | Transistor | Fairchild Semiconductor |
| R1_1 | 249R | 1% | | | 1206 | Resistor | Yageo |
| R2_1 | 2R | 1% | 0.5 W | | 1210 | Resistor | Stackpole Electronics Inc. |
| R4_1 | 0R68 | 1% | | | 1206 | Resistor | Bourns Inc. |
| R17_1 | 0R | | | | 1206 | Resistor | |
| U1_1 | | | | | SOIC8E | IC | Monolithic Power |
| Component Block 2 | | | | | | | |
| R9, R10, R10, R12, R13, R14, R15, R16 | 0R | | 1 W | | 2512 | Resistor | Yageo |
| Component Block 3 | | | | | | | |
| C1_2, C2_2 | 1 u | | 250 V | X7T | 1812 | Capacitor | TDK |
| C3_2, C4_2, C6_2 | 0.1 u | | 250 V | X7T | 0805 | Capacitor | TDK |
| D37_2 | 85 V | | 600 W | | SMB | TVS Diode | Vishay |
| D38_2, D39_2, D40_2 | 1 A | | 600 V | | SMA | General purpose Diode | ON Semiconductor |
| D41_2 | 91 V | | 3 W | | SMB | Zener diode | On Semiconductor |
| D42_2 | 2 A | | 150 V | | SMA | Schottky diode | STMicroelectronics |
| L1_2 | 100 uH | | 0.8 A | | SD8328 | Inductor | Coiltronics |
| L2_2 | 820 uH | | 0.42 A | | SRR1240 | Inductor | Bourns |
| Q1_2 | | | 400 V, 4 A, 30 W | | DPAK | Transistor | Fairchild Semiconductor |
| R1_2 | 249R | 1% | | | 1206 | Resistor | Yageo |
| R2_2 | 2R | 1% | 0.5 W | | 1210 | Resistor | Stackpole Electronics Inc. |
| R4_2 | 0R68 | 1% | | | 1206 | Resistor | Bourns Inc. |
| R17_2 | 0R | | | | 1206 | Resistor | |
| U1_2 | | | | | SOIC8E | IC | Monolithic Power |

Each LED zone 40 comprises a series of spaced apart LEDs connected to an electrical component zone 30. In this alternative, the board length is 60 inches (~152 cm), the board width is 4 inches (~10 cm) and the hoard thickness is 0.062 inches (0.157 cm). The board is comprised of two layers, a top copper layer and a bottom fiberglass layer. Proximate three of the four electrical component zones 30 are jumpers to allow for a "jump" in current from one side of the PCB to another side of the PCB. In this alternative, said jumpers are comprised of shunt resistors. In this alternative, proximate one end of the printed circuit board is a wire passage aperture 50 (in some instances there is no wire passage aperture); and alternatively there are a series of spaced apart circular mounting apertures for connecting the printed circuit board 10 to a mounting assembly. The channels forming the mechanical stress relief zones may be cut out, bored, routed out (drilled and milled) and any other process known to a person skilled in the art. In one alternative, as best seen in FIG. 1 there are two series of spaced part parallel slots running normal to the length of the PCB. The first series are slots running along the first side of the PCB with each slot being 30 mm in length, 5 mm in width and a distance of 18 mm between adjacent slots (centre line 10 centre line). A second series of slots running along the other side of the PCB with each slot being 14 mm in length, 5 mm in width and a distance of 0.18 mm between adjacent slots (centre line to centre line).

Figure 2:
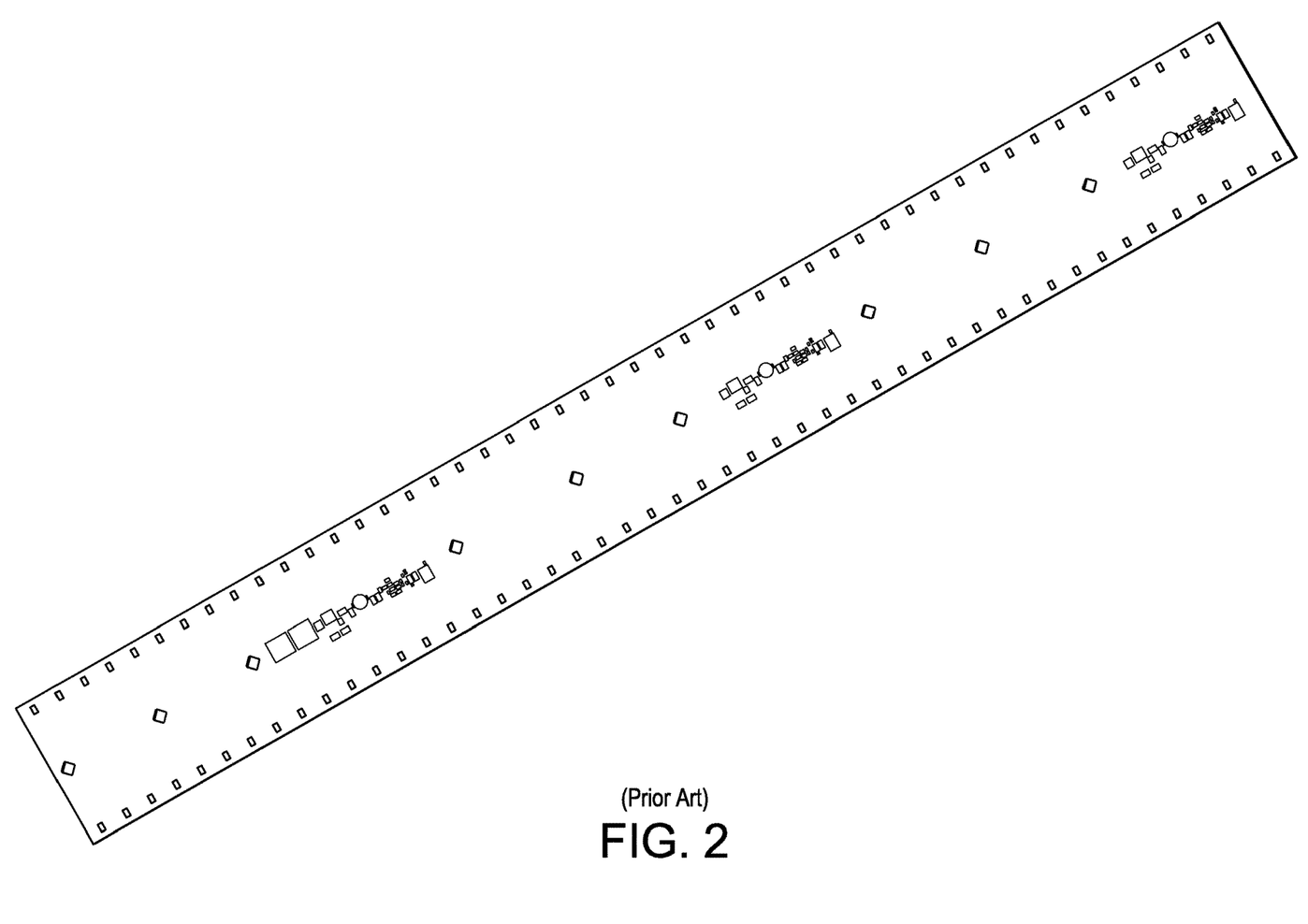
FIG. 2 is a perspective view of a prior art PCB board.

Referring now to FIG. 2, there is shown a typical PRIOR ART printed circuit board with no mechanical stress relief zones.

Example 1—Stress Test of Two 48 Inch Standard PCB

Two 48 inch standard PCBs with no mechanical stress relief zones with a series of electrical component zones and LED zones were bent repeatedly to assess damage. One end of the PCB was secured to a hard surface while the other end remained free. The free end of the PCB was raised and flexed to the point the secured end and the free end formed an approximate angle of about 50 degrees with the hard surface and then the free end was returned to the hard surface. After each flex, once damage was suspected or observed, the PCB was assessed for electrical component and LED integrity (i.e. by powering up the PCB and assessment of further damage).

The first 48 inch standard board exhibited a broken inductor after flexing 22 times. The second 48 inch standard board exhibited a broken inductor after flexing 9 times.

Example 2—Stress Test of a 60 Inch PCB with Mechanical Stress Relief Zones

Figure 3:
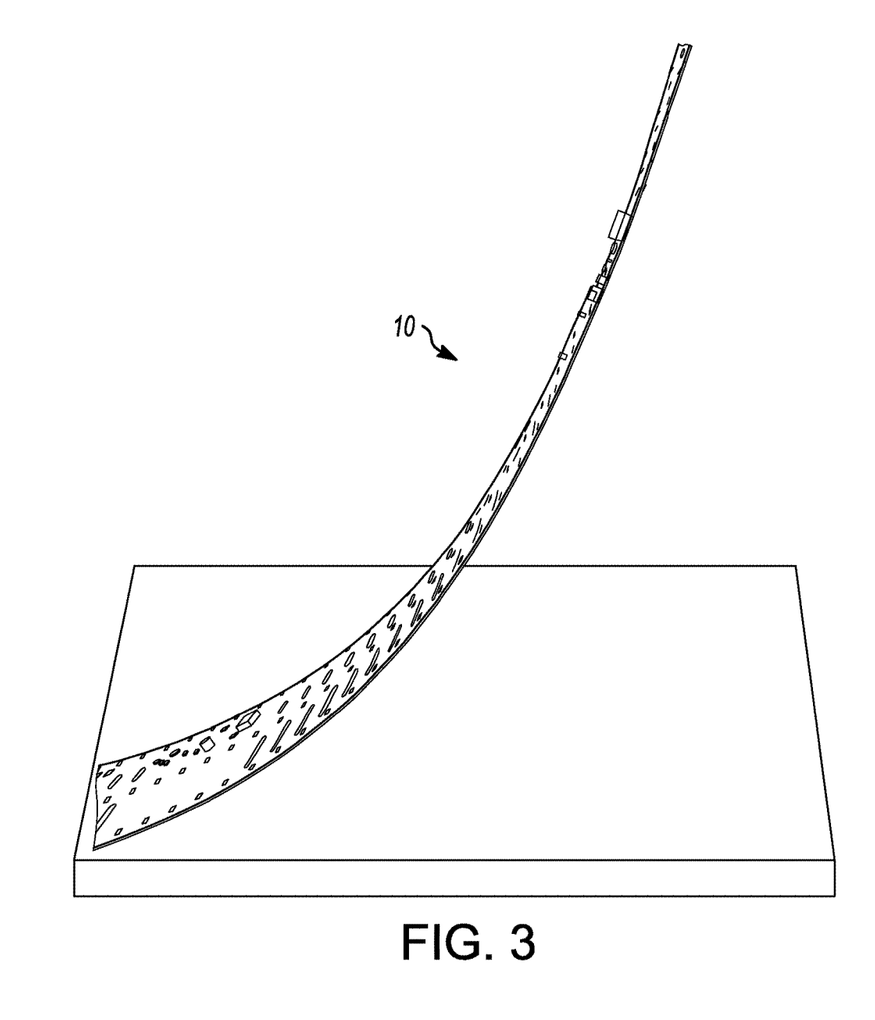
FIG. 3 is a side view of a PCB board undergoing stress testing according to one alternative of the disclosure.

One 60 inch standard PCB with mechanical stress relief zones with a series of electrical component zones and LED zones (See FIG. 3) was bent repeatedly to assess damage. One end of the PCB was secured to hard surface while the other end remained free. The free end of the PCB was raised and flexed to the point the secured end and the free end formed an approximate angle of 60 degrees with the hard surface (See FIG. 3) and then the free end was returned to the hard surface. After each flex, electrical component and LED integrity were measured (i.e. by powering up the PCB and assessment of further damage).

The 60 inch PCB with mechanical stress relief zone exhibited no damage even after more than 100 flexes.

As many changes can be made to the preferred embodiment without departing from the scope thereof; it is intended that all matter contained herein be considered illustrative and not in a limiting sense.

The invention claimed is:

1. A printed circuit board (PCB) comprising a flexible board having at least one mechanical stress relief zone and at least one electrical component, wherein said at least one mechanical stress relief zone allows said PCB to flex proximate said at least one mechanical stress relief zone of the PCB without compromising said at least one electrical component zone when said PCB is flexed or bent, from an unflexed state, during handling or installation; and wherein said PCB returns to said unflexed state when not flexed or bent.

2. The PCB of claim 1 wherein said at least one electrical component is distant said at least one mechanical stress relief zone.

3. The PCB of claim 2 wherein said at least one mechanical stress relief zone is at least one aperture extending from a top of said PCB board through to a bottom of said PCB board such that said at least one aperture allowing for said PCB to flex proximate said at least one mechanical stress relief zone when said PCB is under stress.

4. The PCB of claim 3 wherein said at least one aperture is situated substantially normal to a length of the PCB.

5. The PCB of claim 3 wherein said at least one aperture is a slot.

6. The PCB of claim 2 wherein said at least one mechanical stress relief zone is a plurality of apertures extending from a top of said PCB board through to a bottom of said PCB board such that said plurality of apertures allowing for said PCB to flex proximate said at least one mechanical stress relief zone when said PCB is under stress.

7. The PCB of claim 2 wherein said at least one electrical component comprises a plurality of electrical components selected from the group consisting of LED, LED controller, resistor, capacitor, diode, inductor, transistor, integrated circuit and combinations thereof.

8. The PCB of claim 1 wherein said at least one mechanical stress relief zone is at least one aperture extending from a top of said PCB board through to a bottom of said PCB board such that said at least one aperture allowing for said PCB to flex proximate said at least one mechanical stress relief zone when said PCB is under stress.

9. The PCB of claim 8 wherein said at least one aperture is situated substantially normal to a length of the PCB.

10. The PCB of claim 8 wherein said at least one aperture is a slot.

11. The PCB of claim 1 wherein said at least one mechanical stress relief zone is a plurality of apertures extending from a top of said PCB board through to a bottom of said PCB board such that said plurality of apertures allowing for said PCB to flex proximate said at least one mechanical stress relief zone when said PCB is under stress.

12. The PCB of claim 11 wherein said plurality of apertures are a plurality of slots.

13. The PCB of claim 12 wherein said plurality of slots are situated substantially normal to a length of the PCB.

14. The PCB of claim 13 wherein said plurality of apertures are slots parallel to each other.

15. The PCB of claim 1 further comprising a plurality of mechanical stress relief zones and a plurality of electrical components.

16. The PCB of claim 1 wherein said at least one electrical component comprises a plurality of electrical components selected from the group consisting of LED, LED controller, resistor, capacitor, diode, inductor, transistor, integrated circuit and combinations thereof.

17. The PCB of claim 1 wherein said at least one mechanical stress relief zone has a first thickness and said at least one electrical component has a second thickness wherein said first thickness is less than said second thickness such that said second thickness allowing for said PCB to flex proximate said at least one mechanical stress relief zone when said PCB is under stress.

18. A printed circuit board (PCB) comprising a flexible board having a length of at least about 15 inches, wherein said PCB further comprises at least one mechanical stress relief zone and at least one electrical component distant said at least one mechanical stress relief zone, said at least one mechanical stress relief zone allowing for said PCB to flex proximate said at least one mechanical stress relief zone when under stress while maintaining said at least one electrical component rigid and not compromising any solder joints or connections while under stress when said PCB is flexed or bent, from an unflexed state, during handling or installation and wherein said PCB returns to said unflexed state when not flexed or bent.

19. The PCB of claim 18 wherein the length is from about 15 inches to about 60 inches.

20. A printed circuit board (PCB) comprising a flexible board having a length between about 15 to about 60 inches, width between about 0.75 to about 4 inches and a thickness of between about 0.03 to about 0.12 inches wherein said PCB further comprises a series of layers wherein the first layer is a copper layer, the second layer is a fiberglass layer and the third optional layer is a copper layer, said layers being adhered to each other; said PCB further comprising at least one electrical component selected from LED, LED controller, resistor, capacitor, diode, inductor, transistor, integrated circuit and combinations thereof, and at least one mechanical stress relief zone proximate said at least one electrical component zone; said at least one mechanical stress relief zone comprising at least one area on the PCB with a thickness less than a thickness of said at least one electrical component zone, and wherein the PCB can flex or bend, from an unflexed state, during handling or installation without compromising any solder or joints or connections while under stress; and return to said unflexed state when not under stress.

21. The PCB of claim 20 wherein said at least one mechanical stress relief zone is an aperture extending from a top of said PCB to a bottom of said PCB.

22. The PCB of claim 21 wherein said at least one mechanical stress relief zone is a slot running substantially normal to said length of said PCB.

23. A printed circuit board (PCB) comprising a flexible board having two elongated sides opposite one another, said flexible board having at least one electrical component positioned adjacent only one of said two elongated sides and at least one mechanical stress relief zone positioned adjacent said other elongated side and wherein said at least one mechanical stress relief zone allows said PCB to flex, from an unflexed state, proximate said at least one mechanical stress relief zone of the PCB without compromising said at least one electrical component; and to return to said unflexed state when not under stress.

* * * * *